(12) United States Patent
Chen

(10) Patent No.: US 12,324,356 B2
(45) Date of Patent: Jun. 3, 2025

(54) PIEZOELECTRIC ELEMENT, PIEZOELECTRIC VIBRATOR AND MANUFACTURING METHOD THEREOF, AND ELECTRONIC DEVICE

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 918 days.

(21) Appl. No.: 17/489,154

(22) Filed: Sep. 29, 2021

(65) Prior Publication Data

US 2022/0165931 A1 May 26, 2022

(30) Foreign Application Priority Data

Nov. 24, 2020 (CN) .......................... 202011335665.X

(51) Int. Cl.
*H10N 30/88* (2023.01)
*H10N 30/02* (2023.01)
(Continued)

(52) U.S. Cl.
CPC ........... *H10N 30/883* (2023.02); *H10N 30/02* (2023.02); *H10N 30/06* (2023.02); *H10N 30/20* (2023.02);
(Continued)

(58) Field of Classification Search
CPC .. H03H 3/02; H03H 9/02; H03H 9/19; H10N 30/883; H10N 30/06; H10N 30/02;
(Continued)

(56) References Cited

U.S. PATENT DOCUMENTS

2008/0030107 A1 2/2008 Dalla Piazza
2014/0215784 A1* 8/2014 Lhuillier ................ G21C 17/00
29/25.35
2018/0076381 A1 3/2018 Furuya et al.

FOREIGN PATENT DOCUMENTS

CN 103762303 A 4/2014
CN 105322067 A 2/2016
(Continued)

OTHER PUBLICATIONS

Kaizhuo Lei, et al. "A New Type of Piezoelectric Ceramic Polarization Device." Mechanical Science and Technology for Aerospace Engineering. 29(2). Feb. 2010.
(Continued)

*Primary Examiner* — J. San Martin
(74) *Attorney, Agent, or Firm* — IPro, PLLC

(57) ABSTRACT

A piezoelectric element, a piezoelectric vibrator and a manufacturing method thereof, and an electronic device, a piezoelectric structure is arranged on a first electrode, and a second electrode is arranged on the piezoelectric structure, wherein the second electrode includes a conductive layer and an anti-oxidation layer arranged on the piezoelectric structure in sequence. The conductive layer is configured to generate, when a breakdown short circuit occurs in the piezoelectric element, solid solution between a breakdown location of the piezoelectric element and anti-oxidation layer, and oxidize to generate an insulating material. The conductive layer and anti-oxidation layer are used as top electrodes of the piezoelectric element, when the breakdown short circuit occurs in the piezoelectric structure of the piezoelectric element, the conductive layer is melted by a huge amount of heat generated by the short circuit, a solid solution is formed by the anti-oxidation layer and the conductive layer.

20 Claims, 3 Drawing Sheets

(51) Int. Cl.
*H10N 30/06* (2023.01)
*H10N 30/20* (2023.01)
*H10N 30/853* (2023.01)
*H10N 30/87* (2023.01)

(52) U.S. Cl.
CPC ....... *H10N 30/8554* (2023.02); *H10N 30/875* (2023.02); *H10N 30/878* (2023.02)

(58) Field of Classification Search
CPC .. H10N 30/20; H10N 30/878; H10N 30/8554; H10N 30/875; H10N 30/87
See application file for complete search history.

(56) References Cited

FOREIGN PATENT DOCUMENTS

| | | |
|---|---|---|
| CN | 213879781 U | 8/2021 |
| WO | 2013164540 A1 | 11/2013 |

OTHER PUBLICATIONS

CN202011335665.X first office action dated Dec. 28, 2024.

\* cited by examiner

PIEZOELECTRIC ELEMENT, PIEZOELECTRIC VIBRATOR AND MANUFACTURING METHOD THEREOF, AND ELECTRONIC DEVICE

CROSS REFERENCE TO RELEVANT DISCLOSURES

The present application claims the priority of the Chinese patent application filed on Nov. 24, 2020 before the Chinese Patent Office with the application number of 202011335665.X and the title of "PIEZOELECTRIC ELEMENT, PIEZOELECTRIC VIBRATOR AND MANUFACTURING METHOD THEREOF, AND ELECTRONIC DEVICE", which is incorporated herein in its entirety by reference.

TECHNICAL FIELD

The present disclosure relates to the field of piezoelectric technologies, and more particularly, to a piezoelectric element, a piezoelectric vibrator and a manufacturing method thereof, and an electronic device.

BACKGROUND

With rapid progress of electronic technologies, people have increasingly high requirements on user experience for electronic devices. Most existing electronic devices only can provide visual and auditory experiences and cannot provide tactile experiences to users. In this case, tactile representation technologies emerge.

In the existing tactile representation technologies, piezoelectric elements are arranged in the electronic device, to provide tactile feedback by means of vibration of the piezoelectric elements.

SUMMARY

The present disclosure provides a piezoelectric element, a piezoelectric vibrator and a manufacturing method thereof, and an electronic device.

The present disclosure provides a piezoelectric element, which includes: a first electrode, a piezoelectric structure arranged on the first electrode, and a second electrode arranged on the piezoelectric structure. The second electrode includes a conductive layer and an anti-oxidation layer sequentially arranged on the piezoelectric structure.

The conductive layer is configured to generate, when a breakdown short circuit occurs in the piezoelectric element, solid solution between a breakdown location of the piezoelectric element and the anti-oxidation layer, and oxidize to generate an insulating material.

Alternatively, a material of the conductive layer is indium, and a material of the anti-oxidation layer is gold.

Alternatively, along a direction perpendicular to a plane where the first electrode is positioned, a thickness of the conductive layer ranges from 485 nm to 515 nm, and a thickness of the anti-oxidation layer ranges from 13.5 nm to 16.5 nm.

Alternatively, the second electrode further comprises an adhesion layer arranged between the piezoelectric structure and the conductive layer.

Alternatively, a material of the adhesion layer is nickel, and along the direction perpendicular to the plane where the first electrode is positioned, a thickness of the adhesion layer ranges from 9 nm to 11 nm.

Alternatively, a material of the piezoelectric structure is piezoelectric ceramic, and along the direction perpendicular to the plane where the first electrode is positioned, a thickness of the piezoelectric structure is less than 5 µm.

Alternatively, a material of the first electrode is indium tin oxide, and along the direction perpendicular to the plane where the first electrode is positioned, a thickness of the first electrode ranges from 100 nm to 500 nm.

The present disclosure also discloses a piezoelectric vibrator, which includes a substrate and the plurality of piezoelectric elements arranged on the substrate.

Alternatively, the piezoelectric vibrator further comprises an insulating layer covering the substrate and each of the plurality of piezoelectric elements, and the insulating layer is provided with a first via hole and a second via hole corresponding to each of the plurality of piezoelectric elements.

The piezoelectric vibrator further comprises a wiring layer arranged on a side of the insulating layer away from the piezoelectric element. The wiring layer comprises a first signal line and a second signal line corresponding to each of the plurality of piezoelectric elements. Each of the plurality of first signal lines is connected to the first electrode in the corresponding piezoelectric element through the first via hole, and each of the plurality of second signal lines is connected to the second electrode in the corresponding piezoelectric element through the second via hole.

The present disclosure also discloses manufacturing method of a piezoelectric vibrator, and the method includes:
  forming a plurality of first electrodes on a substrate;
  forming a piezoelectric structure on each of the plurality of first electrodes;
  forming a conductive layer on each of the plurality of piezoelectric structures; and
  forming an anti-oxidation layer on each of the plurality of conductive layers to obtain a plurality of piezoelectric elements.

The conductive layer is configured to generate, when a breakdown short circuit occurs in the piezoelectric element, solid solution between a breakdown location of the piezoelectric element and the anti-oxidation layer, and oxidize to generate an insulating material.

Alternatively, after the step of forming a piezoelectric structure on each of the plurality of first electrodes, the method further comprises:
  forming an adhesion layer on each of the plurality of piezoelectric structures, the conductive layer being positioned on a side of the adhesion layer away from the piezoelectric structure.

Alternatively, after forming an anti-oxidation layer on each of the plurality of conductive layers to obtain a plurality of piezoelectric elements, the method further comprises:
  forming an insulating layer covering the substrate and each of the plurality of piezoelectric elements, the insulating layer being provided with a first via hole and a second via hole corresponding to each of the plurality of piezoelectric elements; and
  forming a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the second electrode in the corresponding piezoelectric element through the second via hole.

The present disclosure also discloses an electronic device, which includes the above-mentioned piezoelectric vibrator.

BRIEF DESCRIPTION OF THE DRAWINGS

To describe the technical solutions in the embodiments of the present disclosure or in the prior art more clearly, the following briefly introduces the accompanying drawings to be used in the descriptions of the embodiments or the prior art. Obviously, the accompanying drawings in the following description show merely some embodiments of the present disclosure, and a person of ordinary skills in the art may still derive other drawings from these accompanying drawings without creative efforts.

DETAILED DESCRIPTION

To make the foregoing objectives, features, and advantages of the present disclosure more apparent and lucid, the present disclosure is further described in detail below with reference to the accompanying drawings and embodiments.

Figure 1:
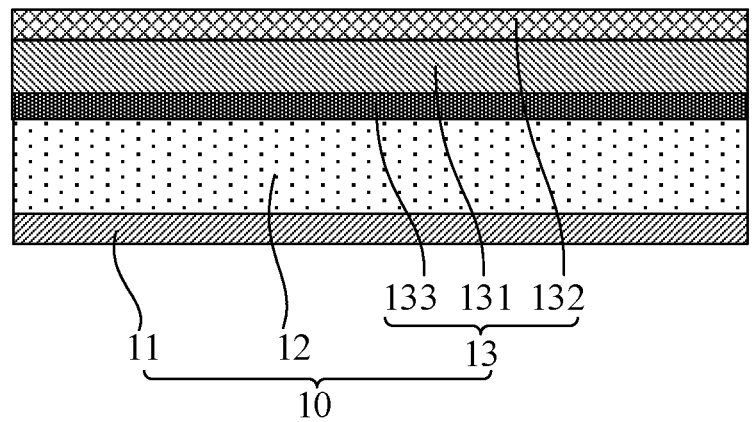
FIG. 1 is a schematic structural diagram of a piezoelectric element according to an embodiment of the present disclosure.

Referring FIG. 1, a schematic structural diagram of a piezoelectric element according to an embodiment of the present disclosure is illustrated.

This embodiment of the present disclosure provides a piezoelectric element 10, which includes a first electrode 11, a piezoelectric structure 12 arranged on the first electrode 11, and a second electrode 13 arranged on the piezoelectric structure 12. The second electrode 13 includes a conductive layer 131 and an anti-oxidation layer 132 arranged on the piezoelectric structure 12 in sequence. The conductive layer 131 is configured to generate, when a breakdown short circuit occurs in the piezoelectric element 10, solid solution between a breakdown location of the piezoelectric element 10 and the anti-oxidation layer 132, and oxidize to generate an insulating material.

In an actual product, the first electrode 11 refers to a bottom electrode of the piezoelectric element 10, and the first electrode 11 may be a planar electrode with a rectangular shape. The piezoelectric structure 12 is arranged on the first electrode 11, and an orthographic projection of the piezoelectric structure 12 on the first electrode 11 is within a region where the first electrode 11 is positioned.

The second electrode 13 is arranged on a side of the piezoelectric structure 12 away from the first electrode 11. The second electrode 13 refers to a top electrode of the piezoelectric element 10. The second electrode 13 is a multi-layered planar electrode, whose shape is also a rectangle. Specifically, the second electrode 13 includes the conductive layer 131 arranged on a side of the piezoelectric structure 12 away from the first electrode 11, and the anti-oxidation layer 132 arranged on a side of the conductive layer 131 away from the piezoelectric structure 12. An orthographic projection of the conductive layer 131 on the first electrode 11 and an orthographic projection of the anti-oxidation layer 132 on the first electrode 11 both cover the orthographic projection of the piezoelectric structure 12 on the first electrode 11, and the orthographic projection of the conductive layer 131 on the first electrode 11 may overlap with the orthographic projection of the anti-oxidation layer 132 on the first electrode 11.

As a main conductive structure in the top electrode, the conductive layer 131 has a lower melting point and readily reacts with oxygen, and a material generated by the oxidation reaction is an insulating material. Therefore, when the piezoelectric element 10 is not short-circuited by breakdown, the anti-oxidation layer 132 needs to be provided to prevent the conductive layer 131 from being oxidized. The anti-oxidation layer 132 is configured to prevent the conductive layer 131 from being oxidized into the insulating material, thereby ensuring the top electrode of the piezoelectric element 10 to be normally conductive.

When the charges on the surfaces of the first electrode 11 and/or the second electrode 13 are distributed non-uniformly or an over high voltage is supplied, the piezoelectric structure 12 in the piezoelectric element 10 may be broken down; that is, a breakdown short circuit occurs in the piezoelectric element 10. In this case, a huge amount of heat may be generated at the breakdown location. Because the melting point of the conductive layer 131 is low, the conductive layer 131 at the breakdown location is melted by the huge amount of heat generated by the short circuiting. As a result, solid dissolving of the anti-oxidation layer 132 happens and the anti-oxidation layer 132 is dissolved into the liquid phase of the conductive layer 131. That is, the anti-oxidation layer 132 and the conductive layer 131 form a solid solution. In this case, the conductive layer 131 is not protected by the anti-oxidation layer 132 any longer. Because the conductive layer 131 easily has oxidation reaction with oxygen, the conductive layer 131 without the anti-oxidation layer 132 may contact oxygen and has oxidation reaction with the oxygen to become the insulating material.

Moreover, the higher a content of the insulating material generated by the oxidation reaction of the conductive layer 131 is, the higher a resistivity of the conductive layer 131 is; and the higher the resistivity of the conductive layer 131 is, the more heat is generated, such that the conductive layer 131 is continuously oxidized to generate the insulating material. In this way, the breakdown location of the piezoelectric element 10 is changed from the short circuit to a broken circuit, and a large number of the insulating materials are generated. That is, the short-circuit location may be burned out by the oxidation reaction of the conductive layer 131, while other locations of the piezoelectric element 10 may be in proper operation. In this way, performance of the piezoelectric element 10 can be restored, and it is avoidable failure of the whole piezoelectric element 10 caused by occurrence of the breakdown short circuit in a certain location of the piezoelectric element 10.

It is to be noted that the solid solution refers to an alloy phase obtained by dissolving solute atoms into lattices of a metal solvent. That is, the solid solution refers to a sosoloid of one or more solvents.

In summary, as can be seen, the material of the conductive layer 131 needs to be conductive, has a lower melting point, readily reacts with oxygen, and generates the insulating material by the oxidation reaction, while the material of the anti-oxidation layer 132 needs to be conductive and not readily react with the oxygen. Therefore, in this embodiment of the present disclosure, indium (In) may be used as the material of the conductive layer 131, and gold (Au) may be used as the material of the anti-oxidation layer 132. That is, the material of the conductive layer 131 is indium, and the material of the anti-oxidation layer 132 is gold.

Indium has a melting point of 156.76° C., which is much lower than a temperature corresponding to the heat generated by the breakdown short circuit, and indium readily reacts with the oxygen to generate indium oxide ($InO_2$), which is an insulating material. Gold is electrically conductive and is not easy to react with the oxygen, such that the conductive layer 131 can be protected. When the piezoelectric element 10 is not short-circuited by breakdown, the conductive layer 131 may be prevented from being oxidized.

In this embodiment of the present disclosure, along a direction perpendicular to a plane where the first electrode 11 is positioned, a thickness of the conductive layer 131 ranges from 485 nm to 515 nm, and a thickness of the anti-oxidation layer 132 ranges from 13.5 nm to 16.5 nm.

For example, the thickness of the conductive layer 131 may be 490 nm, 500 nm, and 510 nm, etc. Preferably, the thickness of the conductive layer 131 is 500 nm. The thickness of the anti-oxidation layer 132 may be 14 nm, 15 nm, and 16 nm. Preferably, the thickness of the anti-oxidation layer 132 is 15 nm.

Further, as shown in FIG. 1, the second electrode 13 further includes an adhesion layer 133 arranged between the piezoelectric structure 12 and the conductive layer 131.

The conductive layer 131 at the breakdown location may be molten when the piezoelectric element 10 is broken down and short-circuited. To prevent the melted material of the conductive layer from causing erosion to the piezoelectric structure 12, an adhesion layer 133 is additionally arranged between the piezoelectric structure 12 and the conductive layer 131. The adhesion layer 133 can serve to adhere the top electrode and the piezoelectric structure 12 while preventing the melted material of the conductive layer from causing erosion to the piezoelectric structure 12.

In this case, the second electrode 13 of the piezoelectric element 10 includes an adhesion layer 133 arranged on a side of the piezoelectric structure 12 away from the first electrode 11, a conductive layer 131 arranged on a side of the adhesion layer 133 away from the piezoelectric structure 12, and an anti-oxidation layer 132 on a side of the conductive layer 131 away from the piezoelectric structure 12. Furthermore, an orthographic projection of the adhesion layer 133 on the first electrode 11 also covers the orthographic projection of the piezoelectric structure 12 on the first electrode 11, and the orthographic projections of the conductive layer 131, the anti-oxidation layer 132 and the adhesion layer 133 on the first electrode 11 may overlap.

A material of the adhesion layer 133 is nickel (Ni), and in the direction perpendicular to the plane where the first electrode 11 is positioned, a thickness of the adhesion layer 133 ranges from 9 nm to 11 nm. For example, the thickness of the adhesion layer 133 may be 9.5 nm, 10 nm, and 10.5 nm, etc. Preferably, the thickness of the adhesion layer 133 is 10 nm.

In this embodiment of the present disclosure, a material of the piezoelectric structure 12 is piezoelectric ceramic (PZT). For example, the piezoelectric ceramic may be lead zirconate titanate binary system piezoelectric ceramic, which has a chemical formula of $Pb(Zr_{1-x}Ti_x)O_3$, belonging to an $ABO_3$ perovskite structure.

Along the direction perpendicular to a plane where the first electrode 11 is positioned, a thickness of the piezoelectric structure 12 is less than 5 μm. For example, the thickness of the piezoelectric structure 12 may be 2 μm, 3 μm, and 4 μm, etc. Preferably, the thickness of the piezoelectric structure 12 is 2 μm.

In this embodiment of the present disclosure, a material of the first electrode 11 is indium tin oxide (ITO). Of course, the material of the first electrode 11 may also be other conductive materials. For example, the material of the first electrode 11 is platinum (Pt).

Along the direction perpendicular to the plane where the first electrode 11 is positioned, a thickness of the first electrode 11 ranges from 100 nm to 500 nm. For example, the thickness of the first electrode 11 may be 200 nm, 300 nm, 400 nm, and so on.

In this embodiment of the present disclosure, the conductive layer and the anti-oxidation layer are used as top electrodes of the piezoelectric element. When the breakdown short circuit occurs in the piezoelectric structure of the piezoelectric element, the conductive layer is melted by a huge amount of heat generated by the short circuit, such that a solid solution is formed by the anti-oxidation layer and the conductive layer. An oxidation reaction occurs in the conductive layer lack of the anti-oxidation layer, such that the insulating material is generated, and thus the breakdown location of the piezoelectric element is changed from the short circuit to a broken circuit, while other locations of the piezoelectric element may be in proper operation. In this way, it is avoidable failure of the whole piezoelectric element caused by occurrence of the breakdown short circuit in a certain location of the piezoelectric element.

Figure 2:
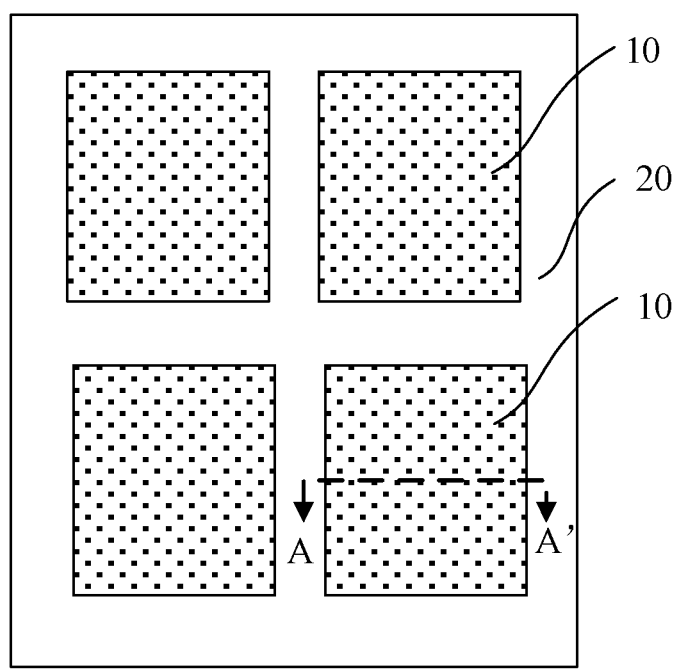
FIG. 2 is a planar schematic structural diagram of a piezoelectric vibrator according to an embodiment of the present disclosure.
Figure 3:
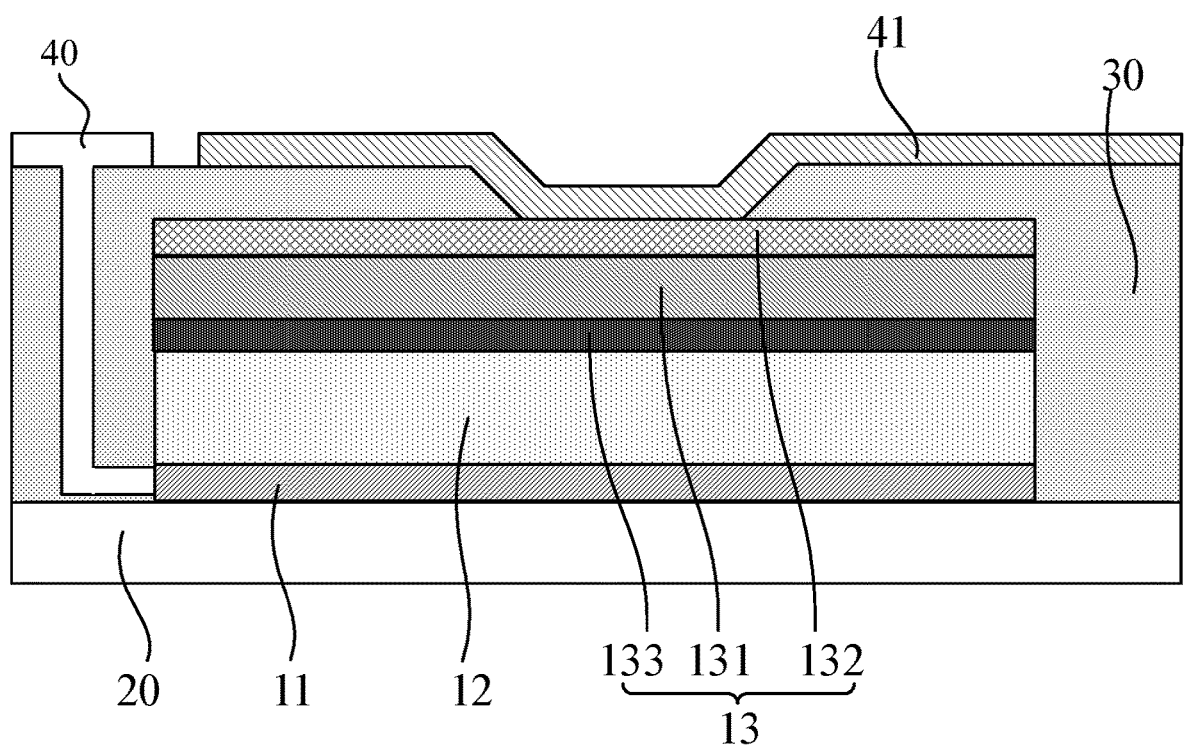
FIG. 3 is a schematic structural diagram of a piezoelectric vibrator according to an embodiment of the present disclosure.

Referring to FIG. 2, FIG. 2 illustrates a schematic plan diagram of a piezoelectric vibrator according to an embodiment of the present disclosure, FIG. 3 illustrates a schematic structural diagram of a piezoelectric vibrator according to an embodiment of the present disclosure, and FIG. 3 is a section view of FIG. 2 along a section A-A'.

This embodiment of the present disclosure provides a piezoelectric vibrator, which includes a substrate 20 and the plurality of piezoelectric elements 10 arranged on the substrate 20.

The substrate 20 may be a flexible substrate or a rigid substrate. For example, a material of the flexible substrate may be Polyimide (PI), Polyethylene Terephthalate (PET) or Polydimethylsiloxane (PDMS), and the rigid substrate may actually be a glass substrate.

The substrate 20 is provided with the plurality of piezoelectric elements 10. Specifically, the substrate 20 is arranged on a side of the first electrode 11 away from the piezoelectric structure 12. That is, the substrate 20 is in direct contact with the first electrode 11 in the piezoelectric element 10.

Further, the piezoelectric vibrator also includes an insulating layer 30 covering the substrate 20 and each of the plurality of piezoelectric elements 10, wherein the insulating layer 30 is provided with a first via hole and a second via hole corresponding to each of the plurality of piezoelectric elements 10. The piezoelectric vibrator also includes a wiring layer arranged on a side of the insulating layer 30 away from each of the plurality of piezoelectric elements 10, wherein the wiring layer includes a first signal line 40 and a second signal line 41 corresponding to each of the plurality of piezoelectric elements 10. Each of the plurality of first signal lines 40 is connected to the first electrode 11 in the corresponding piezoelectric element 10 via the first via hole, and each of the plurality of second signal lines 41 is connected to the second electrode 13 in the corresponding piezoelectric element 10 via the second via hole.

A material of the insulating layer 30 is at least one of silicon nitride and silicon oxide, and the insulating layer 30 is provided with a plurality of first via holes and a plurality of second via holes penetrative. Each of the plurality of piezoelectric elements 10 corresponds to one of the plurality of first via holes and one of the plurality of second via holes. The plurality of first via holes may allow the first electrode 11 in the piezoelectric element 10 to be exposed, and the plurality of second via holes may allow the second electrode 13 in the piezoelectric element 10 (specifically, the anti-oxidation layer 132 in the second electrode 13) to be exposed.

The insulating layer 30 is provided with a plurality of first signal lines and a plurality of second signal lines 41, and each of the plurality of piezoelectric elements 10 corresponds to one of the plurality of first signal lines and one of the plurality of second signal lines 41. For each of the plurality of piezoelectric elements 10, a first signal line corresponding to this piezoelectric element 10 is connected to the first electrode 11 via the first via hole, to provide a first voltage to the first electrode 11; and a second signal line 41 corresponding to this piezoelectric element 10 is connected to the second electrode 13 (specifically, connected to the anti-oxidation layer 132 in the second electrode 13) via the second via hole, and the second signal line 41 is configured to provide a second voltage to the second electrode 13. Materials of the plurality of first signal lines and the plurality of second signal lines 41 are conductive materials. For example, the materials of the plurality of first signal lines and the plurality of second signal lines 41 are metals or alloys, etc. For example, the materials of the plurality of first signal lines and the plurality of second signal lines 41 are titanium (Ti), copper (Cu), or gold (Au), etc.

In an actual using process, a first voltage signal is inputted to each of the plurality of first signal lines, such that the first voltage is provided to the first electrode 11 in each of the plurality of piezoelectric elements 10. A second voltage signal is inputted to each of the plurality of second signal lines 41, such that a second voltage is provided to the second electrode 13 in each of the plurality of piezoelectric elements 10. The first voltage is not equal to the second voltage. The piezoelectric structure 12 in the piezoelectric element 10 vibrates under control of the first voltage and the second voltage to realize tactile representation.

It is to be noted that for any two adjacent piezoelectric elements 10 in the piezoelectric vibrator, their first electrodes 11 and second electrodes 12 are disconnected from each other, and are insulated by means of the insulating layer 30. In this way, vibration of each of the plurality of piezoelectric elements 10 can be individually controlled.

In this embodiment of the present disclosure, the conductive layer and the anti-oxidation layer are used as top electrodes of the piezoelectric element. When the breakdown short circuit occurs in the piezoelectric structure of the piezoelectric element, the conductive layer is melted by a huge amount of heat generated by the short circuit, such that a solid solution is formed by the anti-oxidation layer and the conductive layer. An oxidation reaction occurs in the conductive layer lack of the anti-oxidation layer, such that the insulating material is generated, and thus the breakdown location of the piezoelectric element is changed from the short circuit to a broken circuit, while other locations of the piezoelectric element may be in proper operation. In this way, it is avoidable failure of the whole piezoelectric element caused by occurrence of the breakdown short circuit in a certain location of the piezoelectric element.

Figure 4:
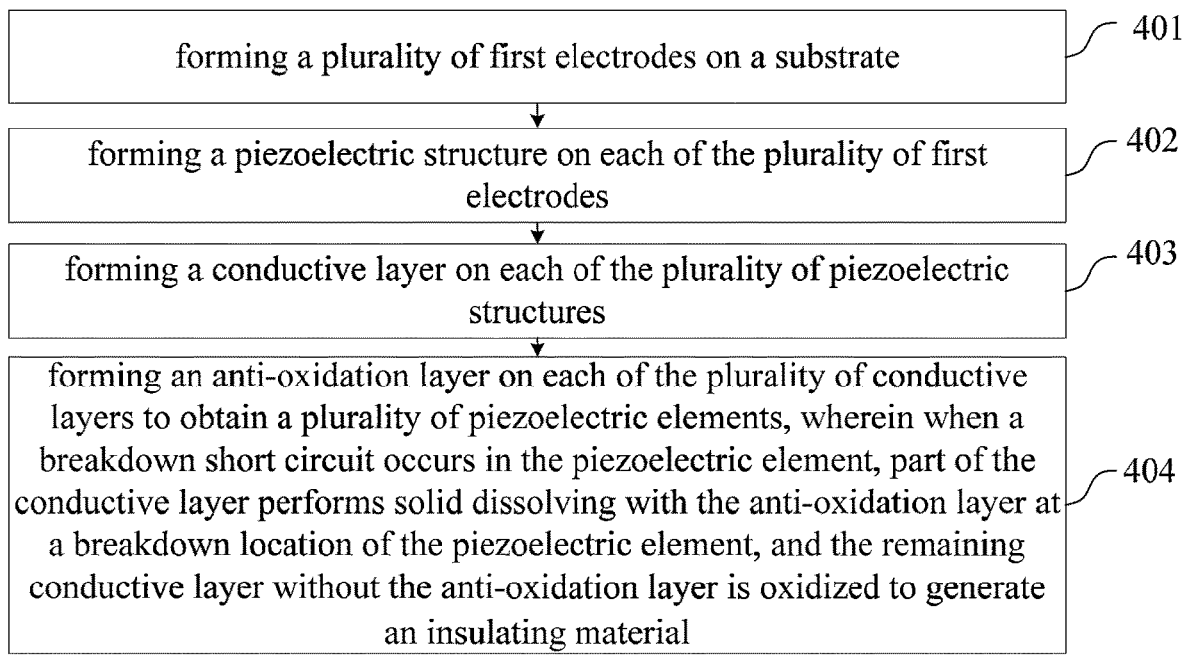
FIG. 4 is a flow diagram of a manufacturing method of a piezoelectric vibrator according to an embodiment of the present disclosure.

Referring to FIG. 4, a flow diagram of a manufacturing method of a piezoelectric vibrator according to an embodiment of the present disclosure is illustrated, and the manufacturing method may specifically include following steps.

Step 401: forming a plurality of first electrodes on a substrate.

In this embodiment of the present disclosure, first, a substrate 20 is provided. The substrate 20 may either be a flexible substrate or a rigid substrate. Then, a plurality of first electrodes 11 are formed on the substrate 20 by adopting a composition process.

Specifically, a first electrode film is deposited on the substrate 20 first, and the first electrode film is subjected to high-temperature annealing treatment in a nitrogen environment to reduce a resistivity of the first electrode film. Next, the first electrode film is coated with a photoresist, and the photoresist is subjected to exposure and development. Next, the first electrode film in a region where the photoresist is removed is etched, and the residual photoresist is removed. In this way, the plurality of first electrodes 11 are formed on the substrate 20, wherein the materials of the plurality of first electrodes 11 are ITO.

Step 402: forming a piezoelectric structure on each of the plurality of first electrodes.

In this embodiment of the present disclosure, after the plurality of first electrodes 11 are formed on the substrate 20, the piezoelectric structure 12 is formed on each of the plurality of first electrodes 11.

Specifically, a piezoelectric film is formed first by means of a dry coating method or a Sol-Gel method. Next, a structure where the piezoelectric film is formed is placed in an air environment at 550-650° C. for high-temperature annealing treatment to realize growth of PZT grains, such that a good solid solution phase is formed. Next, the piezoelectric film is coated with a photoresist, and the photoresist is subjected to exposure and development. Next, the piezoelectric film in a region where the photoresist is removed is etched, such that the piezoelectric structure 12 is formed on each of the plurality of first electrodes 11.

Step 403: forming a conductive layer on each of the plurality of piezoelectric structures.

In this embodiment of the present disclosure, after the piezoelectric structure 12 is formed on each of the plurality of first electrodes 11, a conductive layer 131 is formed on each of the plurality of piezoelectric structures 12.

Specifically, a conductive layer film is deposited first. Next, the conductive layer film is coated with a photoresist, and the photoresist is subjected to exposure and development. Next, the conductive layer film in a region where the photoresist is removed is etched, and the residual photoresist is removed. In this way, the conductive layer 131 is formed on each of the plurality of piezoelectric structures 12.

Step 404: forming an anti-oxidation layer on each of the plurality of conductive layers to obtain a plurality of piezoelectric elements, wherein when a breakdown short circuit occurs in the piezoelectric element, part of the conductive layer performs solid dissolving with the anti-oxidation layer at a breakdown location of the piezoelectric element, and the remaining conductive layer without the anti-oxidation layer is oxidized to generate an insulating material.

In this embodiment of the present disclosure, after the conductive layer 131 is formed on each of the plurality of piezoelectric structures 12, an anti-oxidation layer 132 is formed on each of the plurality of conductive layers 131, such that the plurality of piezoelectric elements 10 are fabricated.

Specifically, an anti-oxidation layer film is deposited first. Next, the anti-oxidation layer film is coated with a photoresist, and the photoresist is subjected to exposure and development. Next, the anti-oxidation layer film in a region where the photoresist is removed is etched, and the residual photoresist is removed. In this way, the anti-oxidation layer 132 is formed on each of the plurality of conductive layers 131.

It is to be noted that after the piezoelectric structure 12 is formed on each first electrode 11, the conductive layer film and the anti-oxidation layer may also be deposited sequentially, a photoresist is coated on the anti-oxidation layer, and the photoresist is subjected to exposure and development. Next, the anti-oxidation layer film and the conductive layer film in a region where the photoresist is removed are etched, and the residual photoresist is removed. In this way, the conductive layer 131 is formed on each of the plurality of piezoelectric structures 12, and the anti-oxidation layer 132 is formed on each of the plurality of conductive layers 131.

A material of the conductive layer 131 is indium, and a material of the anti-oxidation layer 132 is gold. The conductive layer 131 is configured to generate, when a breakdown short circuit occurs in the piezoelectric element 10, solid solution between a breakdown location of the piezoelectric element 10 and the anti-oxidation layer 132, and oxidize to generate an insulating material.

In an alternative implementation of the present disclosure, after Step 402, the method also includes: forming an adhesion layer on each of the plurality of piezoelectric structures, the conductive layer being positioned on a side of the adhesion layer away from the piezoelectric structure.

After the piezoelectric structure 12 is formed on each of the plurality of first electrodes 11, an adhesion layer 133 is first formed on each of the plurality of piezoelectric structures 12, wherein a material of the adhesion layer 133 is nickel. Specifically, an adhesion layer film is deposited first. Next, the adhesion layer film is coated with a photoresist, and the photoresist is subjected to exposure and development. Next, the adhesion layer film in a region where the photoresist is removed is etched, and the residual photoresist is removed. In this way, the adhesion layer 133 is formed on each of the plurality of piezoelectric structures 12. Next, the conductive layer 131 is formed on each of the plurality of adhesion layers 133 by means of one patterning process. At this moment, the conductive layer 131 is positioned on a side of the adhesion layer 133 away from the piezoelectric structure 12. Finally, the anti-oxidation layer 132 is formed on each of the plurality of conductive layers 131 by means of one patterning process.

In this case, the second electrode 13 includes the adhesion layer 133, the conductive layer 131 and the anti-oxidation layer 132 stacked on a side of the piezoelectric structure 12 away from the first electrode 11. The adhesion layer 133, the conductive layer 131 and the anti-oxidation layer 132 are arranged sequentially away from the first electrode 11 along a direction perpendicular to the plane where the first electrode 11 is positioned.

It is to be noted that when the second electrode 13 includes the adhesion layer 133, the conductive layer 131, and the anti-oxidation layer 132 stacked, the adhesion layer film, the conductive layer film, and the anti-oxidation layer film may also be deposited in sequence. The anti-oxidation layer film is coated with a photoresist, and the photoresist is subjected to exposure and development. Next, the anti-oxidation layer film, the conductive layer film, and the adhesion layer film in a region where the photoresist is removed are etched, and the residual photoresist is removed. In this way, the adhesion layer 133 is formed on each of the plurality of piezoelectric structures 12, the conductive layer 131 is formed on each of the plurality of adhesion layers 133, and the anti-oxidation layer 132 is formed on each of the plurality of conductive layers 131.

In an alternative implementation of the present disclosure, after Step 404, the method also includes: forming an insulating layer covering the substrate and each of the plurality of piezoelectric elements, the insulating layer being provided with a first via hole and a second via hole corresponding to each of the plurality of piezoelectric elements; and forming a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the second electrode in the corresponding piezoelectric element through the second via hole.

After the plurality of piezoelectric elements 10 are formed on the substrate 20, the insulating layer 30 covering the substrate 20 and each of the plurality of piezoelectric elements 10 is formed, and the insulating layer 30 is provided with the first via hole and the second hole corresponding to each of the plurality of piezoelectric elements 10. Specifically, the insulating layer 30 is deposited first; then, the insulating layer 30 is coated with a photoresist, the photoresist is subjected to exposure and development; and then, the insulating layer 30 out of a photoresist removal region is etched and residual photoresist is removed, such that the first via hole and the second via hole that penetrate through the insulating layer 30 are formed.

After the insulating layer 30 covering the substrate 20 and each of the plurality of piezoelectric elements 10 is formed, a wiring layer is formed on the insulating layer 30 by means of a patterning process, wherein the wiring layer includes a first signal line (not shown in FIG. 3) and a second signal line 41 corresponding to each of the plurality of piezoelectric elements 10. Each of the plurality of first signal lines is connected to the first electrode 11 in the corresponding piezoelectric element 10 via the first via hole, to provide a first voltage to the first electrode 11. Each of the plurality of second signal lines 41 is connected to the second electrode 13 in the corresponding piezoelectric element 10 via the second via hole, to provide a second voltage to the second electrode 13.

In addition, after the plurality of piezoelectric elements 10 are formed on the substrate 20, it is further necessary to polarize the plurality of piezoelectric elements 10 to increase piezoelectric constants of the piezoelectric structures 12 in the plurality of piezoelectric elements 10, such that the plurality of piezoelectric elements 10 have good piezoelectric characteristics.

It is to be noted that the piezoelectric element 10 may be polarized before the insulating layer 30 and the wiring layer are formed. Furthermore, the piezoelectric element 10 may also be polarized after the insulating layer 30 and the wiring layer are formed. This embodiment of the present disclosure does not limit specific steps of the polarization treatment.

In this embodiment of the present disclosure, the conductive layer and the anti-oxidation layer are used as top electrodes of the piezoelectric element. When the breakdown short circuit occurs in the piezoelectric structure of the piezoelectric element, the conductive layer is melted by a huge amount of heat generated by the short circuit, such that a solid solution is formed by the anti-oxidation layer and the conductive layer. An oxidation reaction occurs in the conductive layer lack of the anti-oxidation layer, such that the insulating material is generated, and thus the breakdown location of the piezoelectric element is changed from the short circuit to a broken circuit, while other locations of the piezoelectric element may be in proper operation. In this way, it is avoidable failure of the whole piezoelectric element caused by occurrence of the breakdown short circuit in a certain location of the piezoelectric element.

The embodiment of the present disclosure further provides an electronic device, including the piezoelectric vibrator.

Reference on specific description about the piezoelectric vibrator may be made to description of the embodiment II and the embodiment III, and no more detailed description is made herein.

In an actual product, the electronic device may be a display apparatus. The display apparatus includes a display panel and the piezoelectric vibrator. The piezoelectric vibrator may be arranged on an outgoing side of the display panel, such that the display apparatus may realize a display function and a tactile representation function simultaneously.

Certainly, the electronic device according to the embodiment of the present disclosure is not limited to the display apparatus, and it may further be any product or part with the tactile representation function.

In this embodiment of the present disclosure, the conductive layer and the anti-oxidation layer are used as top electrodes of the piezoelectric element. When the breakdown short circuit occurs in the piezoelectric structure of the piezoelectric element, the conductive layer is melted by a huge amount of heat generated by the short circuit, such that a solid solution is formed by the anti-oxidation layer and the conductive layer. An oxidation reaction occurs in the conductive layer lack of the anti-oxidation layer, such that the insulating material is generated, and thus the breakdown location of the piezoelectric element is changed from the short circuit to a broken circuit, while other locations of the piezoelectric element may be in proper operation. In this way, it is avoidable failure of the whole piezoelectric element caused by occurrence of the breakdown short circuit in a certain location of the piezoelectric element.

For a brief description, the foregoing method embodiments are described as a combination of a series of motions. However, those skilled in the art should know that the present disclosure is not limited by sequences of the motions described. This is because some steps may be performed by using other sequences or be performed simultaneously in accordance with the present disclosure. In addition, those skilled in the art should also learn that the embodiments described in the specification are preferred embodiments, and involved motions and modules are not necessary for the present disclosure.

The embodiments in the specification are described in a progressive manner. Each embodiment is focused on difference from other embodiments. And cross reference is available for identical or similar parts among different embodiments.

Finally it should be explained that a relational term (such as a first or a second . . . ) is merely intended to separate one entity or operation from another entity or operation instead of requiring or hinting any practical relation or sequence exists among these entities or operations. Furthermore, terms such as "comprise", "include" or other variants thereof are intended to cover a non-exclusive "comprise" so that a process, a method, a merchandise or a device comprising a series of elements not only includes these elements, but also includes other elements not listed explicitly, or also includes inherent elements of the process, the method, the merchandise or the device. In the case of no more restrictions, elements restricted by a sentence "include a . . . " do not exclude the fact that additional identical elements may exist in a process, a method, a merchandise or a device of these elements.

A piezoelectric element, a piezoelectric vibrator and a manufacturing method thereof, and an electronic device provided by the present disclosure are described in detail above. Elaboration of principles and implementations of the present disclosure is made by using specific examples herein, and the description of the foregoing embodiments is merely intended to assist in understanding the method of the present disclosure and the core concept thereof; also, those of ordinary skill in the art may change, in according with the concept of the present disclosure, a concrete implementation and a scope of application. In conclusion, contents of the specification shall be not interpreted as limiting the present disclosure.

The invention claimed is:

1. A piezoelectric element, comprising:
a first electrode;
a piezoelectric structure, arranged on the first electrode; and
a second electrode, arranged on the piezoelectric structure; the second electrode comprising a conductive layer and an anti-oxidation layer sequentially arranged on the piezoelectric structure;
wherein when a breakdown short circuit occurs in the piezoelectric element, part of the conductive layer performs solid dissolving with the anti-oxidation layer at a breakdown location of the piezoelectric element, and the remaining conductive layer without the anti-oxidation layer is oxidized to generate an insulating material.

2. The piezoelectric element according to claim 1, wherein a material of the conductive layer is indium, and a material of the anti-oxidation layer is gold.

3. The piezoelectric element according to claim 1, wherein in a direction perpendicular to a plane where the first electrode is positioned, a thickness of the conductive layer ranges from 485 nm to 515 nm, and a thickness of the anti-oxidation layer granges from 13.5 nm to 16.5 nm.

4. The piezoelectric element according to claim 1, wherein the second electrode further comprises an adhesion layer arranged between the piezoelectric structure and the conductive layer.

5. The piezoelectric element according to claim 4, wherein a material of the adhesion layer is nickel, and in a direction perpendicular to a plane where the first electrode is positioned, a thickness of the adhesion layer ranges from 9 nm to 11 nm.

6. The piezoelectric element according to claim 1, wherein a material of the piezoelectric structure is piezoelectric ceramic, and in a direction perpendicular to a plane where the first electrode is positioned, a thickness of the piezoelectric structure is less than 5 μm.

7. The piezoelectric element according to claim 1, wherein a material of the first electrode is indium tin oxide, and in a direction perpendicular to a plane where the first electrode is positioned, a thickness of the first electrode ranges from 100 nm to 500 nm.

8. A piezoelectric vibrator, comprising:
a substrate; and
a plurality of piezoelectric elements arranged on the substrate,
wherein the piezoelectric element, comprising:
a first electrode;
a piezoelectric structure, arranged on the first electrode; and a second electrode, arranged on the piezoelectric structure; the second electrode comprising a conductive layer and an anti-oxidation layer sequentially arranged on the piezoelectric structure;

wherein when a breakdown short circuit occurs in the piezoelectric element, part of the conductive layer performs solid dissolving with the anti-oxidation layer at a breakdown location of the piezoelectric element, and the remaining conductive layer without the anti-oxidation layer is oxidized to generate an insulating material.

9. The piezoelectric vibrator according to claim 8, wherein a material of the conductive layer is indium, and a material of the anti-oxidation layer is gold.

10. The piezoelectric vibrator according to claim 8, wherein in a direction perpendicular to a plane where the first electrode is positioned, a thickness of the conductive layer ranges from 485 nm to 515 nm, and a thickness of the anti-oxidation layer ranges from 13.5 nm to 16.5 nm.

11. The piezoelectric vibrator according to claim 8, wherein the second electrode further comprises an adhesion layer arranged between the piezoelectric structure and the conductive layer.

12. The piezoelectric vibrator according to claim 8, wherein a material of the piezoelectric structure is piezoelectric ceramic, and in a direction perpendicular to a plane where the first electrode is positioned, a thickness of the piezoelectric structure is less than 5 μm.

13. The piezoelectric vibrator according to claim 8, wherein a material of the first electrode is indium tin oxide, and in a direction perpendicular to a plane where the first electrode is positioned, a thickness of the first electrode ranges from 100 nm to 500 nm.

14. The piezoelectric vibrator according to claim 11, wherein a material of the adhesion layer is nickel, and in a direction perpendicular to a plane where the first electrode is positioned, a thickness of the adhesion layer ranges from 9 nm to 11 nm.

15. The piezoelectric vibrator according to claim 8, wherein the piezoelectric vibrator further comprises an insulating layer covering the substrate and each of the plurality of piezoelectric elements, the insulating layer being provided with a first via hole and a second via hole corresponding to each of the plurality of piezoelectric elements; and the piezoelectric vibrator further comprises a wiring layer arranged on a side of the insulating layer away from the piezoelectric element, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the second electrode in the corresponding piezoelectric element through the second via hole.

16. A method for manufacturing a piezoelectric vibrator, comprising:
forming a plurality of first electrodes on a substrate;
forming a piezoelectric structure on each of the plurality of first electrodes;
forming a conductive layer on each of the plurality of piezoelectric structures; and
forming an anti-oxidation layer on each of the plurality of conductive layers to obtain a plurality of piezoelectric elements;
wherein when a breakdown short circuit occurs in the piezoelectric element, part of the conductive layer performs solid dissolving with the anti-oxidation layer at a breakdown location of the piezoelectric element, and the remaining conductive layer without the anti-oxidation layer is oxidized to generate an insulating material.

17. The method for manufacturing a piezoelectric vibrator according to claim 16, wherein after forming a piezoelectric structure on each of the plurality of first electrodes, the method further comprises:
forming an adhesion layer on each of the plurality of piezoelectric structures, and the conductive layer being positioned on a side of the adhesion layer away from the piezoelectric structure.

18. The method for manufacturing a piezoelectric vibrator according to claim 16, wherein after forming an anti-oxidation layer on each of the plurality of conductive layers to obtain a plurality of piezoelectric elements, the method further comprises:
forming an insulating layer covering the substrate and each of the plurality of piezoelectric elements, the insulating layer being provided with a first via hole and a second via hole corresponding to each of the plurality of piezoelectric elements; and
forming a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the second electrode in the corresponding piezoelectric element through the second via hole.

19. An electronic device, comprising the piezoelectric vibrator according to claim 8.

20. The electronic device according to claim 19, wherein the piezoelectric vibrator further comprises an insulating layer covering the substrate and each of the plurality of piezoelectric elements, the insulating layer being provided with a first via hole and a second via hole corresponding to each of the plurality of piezoelectric elements;
the piezoelectric vibrator further comprises a wiring layer arranged on a side of the insulating layer away from each of the plurality of piezoelectric elements, the wiring layer comprising a first signal line and a second signal line corresponding to each of the plurality of piezoelectric elements, each of the plurality of first signal lines being connected to the first electrode in the corresponding piezoelectric element through the first via hole, and each of the plurality of second signal lines being connected to the second electrode in the corresponding piezoelectric element through the second via hole.

* * * * *